US005598111A

United States Patent [19]
Enomoto

[11] Patent Number: 5,598,111
[45] Date of Patent: Jan. 28, 1997

[54] DELAY CIRCUIT FOR DIGITAL SIGNAL PROCESSING

[75] Inventor: Toshio Enomoto, Tokyo, Japan

[73] Assignee: NEC Corporation, Japan

[21] Appl. No.: 266,589

[22] Filed: Jun. 28, 1994

[30] Foreign Application Priority Data

Aug. 3, 1993 [JP] Japan ................................. 5-191500

[51] Int. Cl.⁶ ...................... H03K 19/0948; H03K 17/16
[52] U.S. Cl. .............................. 326/83; 326/33; 327/264; 327/288; 327/290
[58] Field of Search ............................... 326/83, 121, 31, 326/33–34, 24, 27; 327/288, 284, 285, 290, 263, 264, 544

[56] References Cited

U.S. PATENT DOCUMENTS

| | | | |
|---|---|---|---|
| 4,103,188 | 7/1978 | Morton | 327/433 |
| 4,255,723 | 3/1981 | Ebihara | 326/121 |
| 4,833,473 | 5/1989 | Dingwall | 333/124 |
| 4,837,466 | 6/1989 | Kanauchi | 327/288 |
| 4,906,871 | 3/1990 | Iida | 326/21 |
| 5,041,741 | 8/1991 | Steele | 326/83 |
| 5,051,625 | 9/1991 | Ikeda et al. | 326/27 |
| 5,097,159 | 3/1992 | Seki et al. | 327/264 |
| 5,303,191 | 4/1994 | Eagan et al. | 327/288 |

FOREIGN PATENT DOCUMENTS 62-222715  9/1987  Japan .
64-174609  2/1991  Japan .

OTHER PUBLICATIONS

Mead et al., *Intro to VLSI Systems*, Addison–Wesley, 1980, pp. 33–37.

Primary Examiner—Edward P. Westin
Assistant Examiner—Jon Santamauro
Attorney, Agent, or Firm—Whitham, Curtis, Whitham & McGinn

[57] ABSTRACT

A delay circuit comprises cascade-connected first through third inverters. The second inverter comprises a first resistor one terminal of which is connected to an output of the first inverter; a P-channel MOS transistor a gate of which is connected to the other terminal of the first resistor, and a source of which receives a power supply voltage; an N-channel MOS transistor a gate of which is connected to the other terminal of the first resistor, a source of which receives a ground voltage, and a drain of which is connected to a drain of the P-channel MOS transistor; and a capacitor one terminal of which is connected to the other terminal of the first resistor, and the other terminal of which is connected to the other terminal of a current path of the P-channel MOS transistor. The P-channel MOS transistor and the N-channel MOS transistor switch among a first state in which the P-channel MOS transistor operates in a saturation region and the N-channel MOS transistor operates in a cutoff region, a second state in which the P-channel MOS transistor operates in an active region and the N-channel MOS transistor operates in the active region, and a third state in which the P-channel MOS transistor operates in the cutoff region and the N-channel MOS transistor operates in the saturation region.

2 Claims, 8 Drawing Sheets

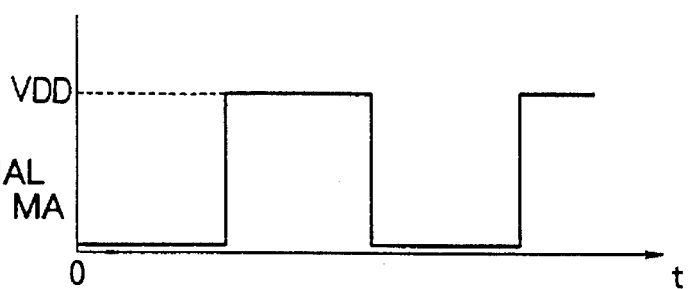
FIG. 8A (PRIOR ART) POTENTIAL OF NODE MA
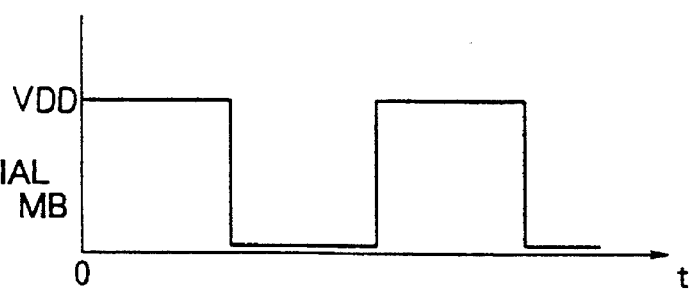
FIG. 8B (PRIOR ART) POTENTIAL OF NODE MB
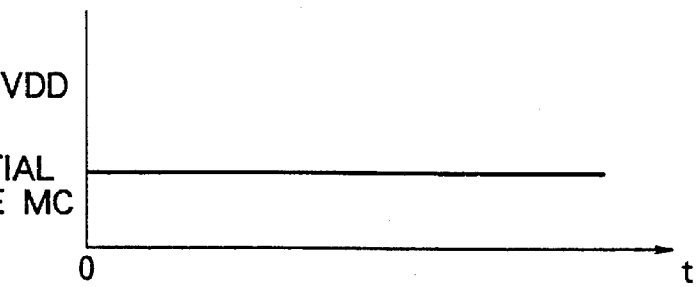
FIG. 8C (PRIOR ART) POTENTIAL OF NODE MC
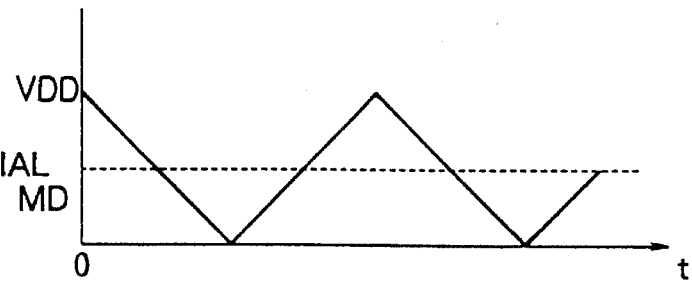
FIG. 8D (PRIOR ART) POTENTIAL OF NODE MD
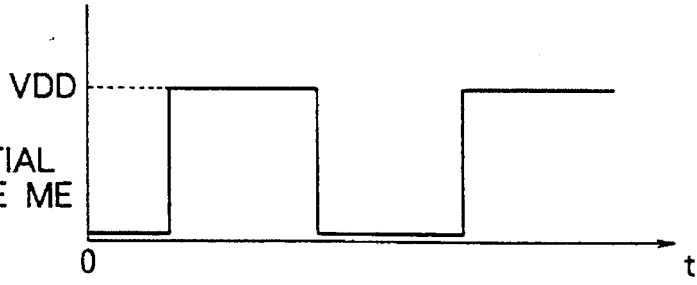
FIG. 8E (PRIOR ART) POTENTIAL OF NODE ME 5,598,111

DELAY CIRCUIT FOR DIGITAL SIGNAL PROCESSING

BACKGROUND OF THE INVENTION

1. Field of the Invention

The present invention relates to a delay circuit, and more particularly a delay circuit for digital signal processing which can secure a longer delay time.

2. Description of the Related Art

FIG. 5 shows an example of a conventional delay circuit. The delay circuit shown in FIG. 5 includes: a first inverter constituted by a first P-channel MOS transistor 5-1 and a first N-channel MOS transistor 5-2; a delay section constituted by a resistor 5-7 and a capacitor 5-8; a second inverter constituted by a second P-channel MOS transistor 5-3 and a second N-channel MOS transistor 5-4; and a third inverter constituted by a third P-channel MOS transistor 5-5 and a third N-channel MOS transistor 5-6.

An operation of the delay circuit shown in FIG. 5 will now be described with reference to FIGS. 6A through 6E. FIGS. 6A through 6E are waveforms showing changes of potentials at nodes NA through NE in the delay circuit.

A potential at the node NA is 0 [V] in the initial state (t=t0). If the capacitor 5-8 is assumed not to be charged, the potentials at the nodes NA through NE will be 0 [V], VDD [V], 0 [V], VDD [V], and 0 [V], respectively at t=t0.

In this state, a current flows from the node NB to the node NC through the resistor 5-7 to charge the capacitor 5-8. For this reason, the potential at the node NC is changed in accordance with the following equation.

$$eC = eB(1 - exp(t/CR))$$

wherein eC represents a potential at the node NC; eB, a potential at the node NB; t, an elapsed time, C, a capacitance of the capacitor 5-8, and R, a resistance of the resistor 5-7.

When the potential at the node NC exceeds a threshold value of the second inverter at t=t1, the potential at the node ND drops to 0 [V].

This potential change is inverted by the third inverter. Accordingly, the potential at the node NE raises to VDD [V]. When a time has elapsed sufficiently longer than a time constant determined by the resistance of the resistor 5-7 and the capacitance of the capacitor 5-8, the capacitor 5-8 is charged and the potential at the node NC becomes VDD [V].

If the potential at the node NA (a potential of an input signal) is assumed to be changed to VDD [V] at t=t2, the potential at the node NB becomes 0 [V], so that the capacitor 5-8 discharges through the resistor 5-7 and the N-channel MOS transistor 5-2.

When the potential at the node NC becomes smaller than the threshold value of the second inverter at t=t3, the potential at the node ND raises up to VDD [V]. Then, the potential at the node NE drops to 0 [V].

From a view point of the comparison of the potential change at the node NA with the potential change at the node NE, a voltage (a signal) at the node NE is a signal in which a signal at the node NA is delayed by the time of t1−t0= t3−t2. More specifically, a digital signal input to the node NA is delayed by (t1−t0) and output to the node NE.

FIG. 7 is a circuit diagram showing a delay circuit of Miller integrator type showing another example of a conventional delay circuit. The delay circuit shown in FIG. 7 comprises a first inverter 7-1, a second inverter 7-2, a third inverter 7-3, a fourth inverter 7-4, and a capacitor 7-5.

An operation of the delay circuit shown in FIG. 7 will now be described with reference to FIGS. 8A through 8E. FIGS. 8A through 8E are waveforms showing changes of potentials at the nodes MA through ME in the delay circuit in FIG. 7.

Assume now that the resistance of the resistor 7-4 and the capacitance of the capacitor 7-5 are represented by R [Ω] and C[F], respectively.

Further, assume that an amplification degree M of the inverter 7-2 is fully large and the potentials at the nodes MA and MD are 0 [V] and VDD [V], respectively in the initial state (t=t0). In this state, the potentials at the nodes MA through ME will be 0 [V], VDD [V], VDD/2 [V], VDD [V], and 0 [V], respectively.

From this state, a current flows from the node MB to the node MC through the resistor 7-4 as the time elapses, and the potential at the node MC raises by Δ1 [V]. This change is amplified by the second inverter 7-2 and thus the potential at the node MD lowers by Δ2 [V].

However, since the capacitor 7-5 is connected between the nodes MC and MD, an output of the second inverter 7-2 is fed back to the input thereof through the capacitor 7-5. This feedback cancels the potential change Δ1 [V] at the node MC so that the potential at the node MC is constantly approximately at VDD/2 [V].

The potential at the node MD is an integrated value of the inverted signal at the node MB and thus has a triangular waveform as shown in FIG. 8D. In this case, the inverter 7-2 linearly amplifies the input signal so that it operates in an active region.

The third inverter 7-3 compares a threshold level (indicated by a broken line in FIG. 8D) with a potential at the node MD and outputs a signal shown in FIG. 8E at the node ME. The potential at the node ME is a signal delayed by a predetermined period of time with respect to the input signal.

According to the conventional delay circuit shown in FIG. 5, a delay time is obtained by comparing a voltage of an output signal of a passive circuit constituted by a resistor 5-2 and a capacitor 5-8 with a threshold value of the third inverter. For this reason, it was difficult to obtain a large delay time. If such large delay time is intended to be obtained by this delay circuit, a time constant of the circuit constituted by the resistor and the capacitor must be made large. However, if the time constant becomes large, an amplitude of a potential at the node NC becomes small as shown in FIG. 4A. For this reason, a change of a threshold value of the succeeding inverter due to the changes of the temperature and the threshold voltage and the like will change the waveform of the output signal, resulting in unstable delay time of the signal. Note that FIG. 4B shows a potential at the node ND.

According to the Miller-integrator type delay circuit shown in FIG. 7, the triangular waveform output from the second inverter 7-2 must not be distorted in order not to distort the output signal waveform. In order to secure the operation of the second inverter, an integrator constituted by the second inverter 7-2, the resistor 7-4 and the capacitor 7-5 must have a sufficiently large dynamic range.

For this reason, it is difficult to use this type of delay circuit as an equipment whose power supply voltage is 2.5 [V] or less such as a portable equipment, and particularly an equipment whose power supply voltage is 1.5 [V] or less.

SUMMARY OF THE INVENTION

The present invention has been intended in view of the above drawbacks and its object is to provide a delay circuit which can secure a longer delay time and operate stably at a low voltage.

In order to achieve the above object, a delay circuit according to the present invention comprises: a first inverter for inverting a signal level of an input signal; a second inverter comprising: a first resistor one terminal of which is connected an output terminal of the first inverter; a P-channel MOS transistor a gate of which is connected to the other terminal of the first resistor and one terminal of a current path of which receives a first voltage; an N-channel MOS transistor a gate of which is connected to the other terminal of the first resistor, one terminal of a current path of which receives a second voltage, and the other terminal of the current path is connected to the other terminal of the current path of the P-channel MOS transistor; and a capacitor one terminal of which is connected to the other terminal of the first resistor and the other terminal of which is connected to the other terminal of the current path of the P-channel MOS transistor; a third inverter an input terminal of which is connected to a node of the current path of the P-channel MOS transistor and the current path of the N-channel MOS transistor, and for inverting a signal level of an output signal of the second inverter;

and wherein the P-channel MOS transistor and the N-channel MOS transistor have:

a first state wherein the P-channel MOS transistor operates in a saturation region and the N-channel MOS transistor operates in a cutoff region; a second state wherein the P-channel MOS transistor operates in an active region and the N-channel MOS transistor operates in the active region; and a third state wherein the P-channel MOS transistor operates in the cutoff region and the N-channel MOS transistor operates in the saturation region.

In order to set the first through third states, a threshold value VTP of the P-channel MOS transistor and a threshold value VTN of the N-channel MOS transistor are set to satisfy the following equations.

$$-2Vdd/5 < VTP < -Vdd/5$$

$$Vdd/5 < VTN < 2Vdd/5$$

Further, the delay circuit according to the present invention may have a resistor cascade-connected to current paths of the P-channel MOS transistor and the N-channel MOS transistor.

According to the delay circuit of the present invention, there is a period in which the P-channel MOS transistor and the N-channel MOS transistor operate in the cutoff region (turned off). For this reason, a delay time longer than that of the conventional circuit can be stably generated using the resistor and the capacitor having the same values as those of the conventional circuit. Furthermore, it is possible to reduce the dissipated power.

BRIEF DESCRIPTION OF THE DRAWINGS

FIGS. 2A through 2E are views showing potentials at nodes in the delay circuit shown in FIG. 1 in which FIGS. 2A through 2E show potentials at the nodes PA, PB, PC, PD, and PE, respectively;

FIGS. 6A through 6E are views showing potentials at nodes in the delay circuit shown in FIG. 5, in which FIGS. 6A through 6E show potentials at the nodes NA, NB, NC, ND, and NE, respectively;

FIGS. 8A through 8E are views showing potentials at nodes in the delay circuit shown in FIG. 7, in which FIGS. 8A through 8E show potentials at the nodes MA, MB, MC, MD, and ME, respectively.

DETAILED DESCRIPTION OF THE PREFERRED EMBODIMENTS

Figure 1:
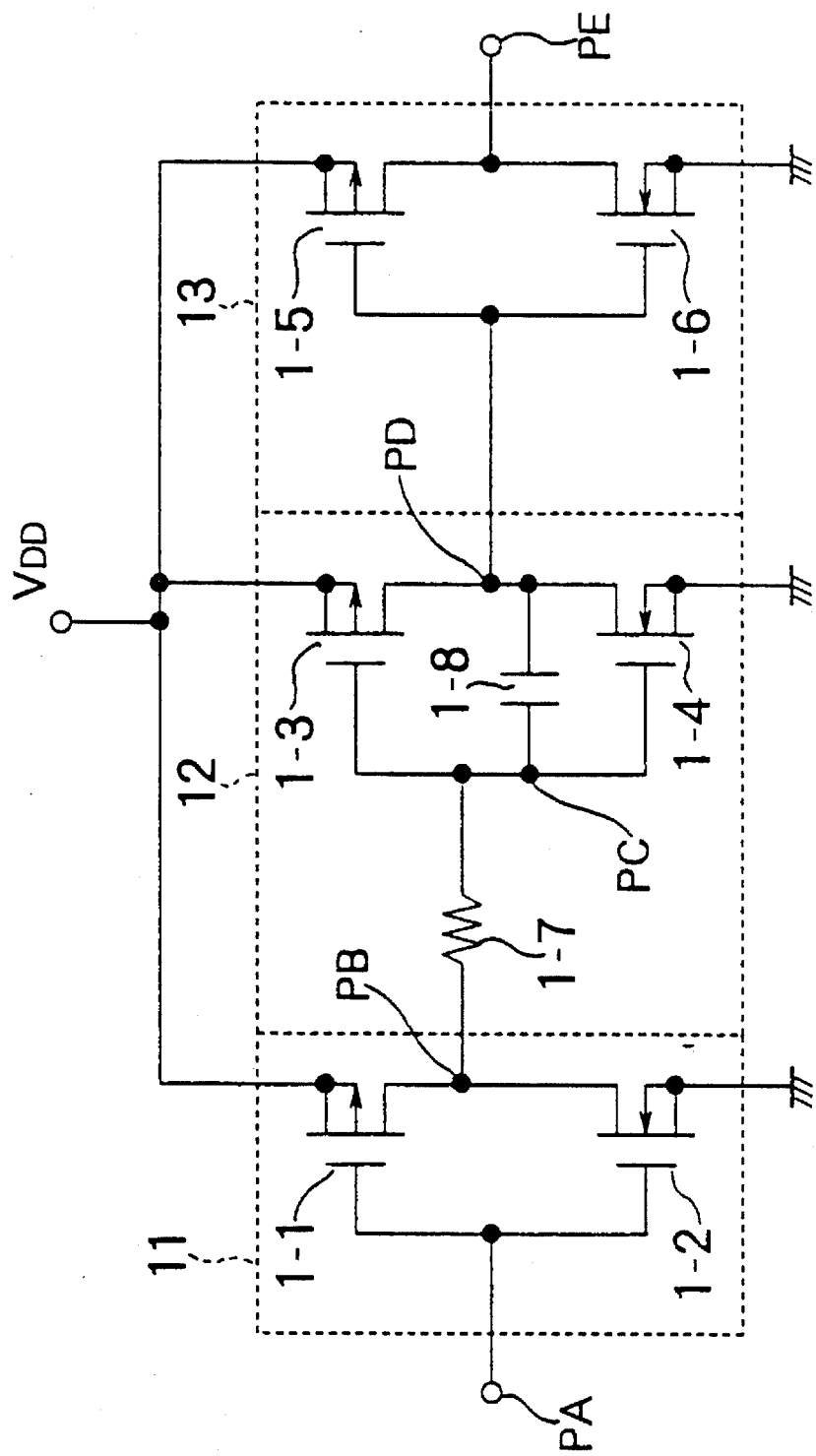
FIG. 1 is a circuit diagram of a delay circuit according to a first embodiment of the present invention.

FIG. 1 is a circuit diagram of a delay circuit according to a first embodiment of the present invention.

The delay circuit according to the embodiment includes: a first inverter 11 constituted by a first P-channel MOS transistor 1-1 and a first N-channel MOS transistor 1-2; a signal delay section 12 constituted by a resistor 1-7, a capacitor 1-8, and a second inverter constituted by a second P-channel MOS transistor 1-3 and a second N-channel MOS transistor; and a waveform-shaping inverter 13 constituted by a third P-channel MOS transistor 1-5 and a third N-channel MOS transistor 1-6.

Current paths of the first P-channel MOS transistor 1-1 and the first N-channel MOS transistor 1-2 constituting the first inverter 11 are cascade-connected between a power supply voltage VDD and a ground.

An output of the first inverter 11 is connected to the gates of the second P-channel MOS transistor 1-3 and the second N-channel MOS transistor 1-4 and one terminal of the capacitor 1-8 through a resistor 1-7. Current paths of the second P-channel MOS transistor 1-3 and the second N-channel MOS transistor 1-4 are cascade-connected between the power supply voltage VDD and the ground. The other terminal of the capacitor 1-8 is connected to a node of the current paths of the second P-channel MOS transistor 1-3 and the second N-channel MOS transistor 1-4.

Current paths of the third P-channel MOS transistor 1-5 and the third N-channel MOS transistor 1-6 constituting the waveform-shaping inverter 13 are cascade-connected between the power supply voltage VDD and the ground. An output signal of the signal delay section 12 is commonly supplied to gates of the third P-channel MOS transistor 1-5 and the third N-channel MOS transistor 1-6.

According to this embodiment, it is assumed that the power supply voltage is 1.5 [V] or less and absolute values of threshold values of the second P-channel MOS transistor 1-3 and the second N-channel MOS transistor 1-4 are equal each other.

An operation of the delay circuit in this embodiment will now be described with reference to FIGS. 2A through 2E showing changes of potentials at the nodes PA through PE. In the initial state (t=t0), if the potentials at the nodes PA and PC are assumed to be 0 [V], the potentials at the nodes PB, PD, and PE will be VDD [V], VDD [V], and 0 [V], respectively. In this state, the second P-channel MOS transistor 1-3 is operating in a saturation region and the second N-channel MOS transistor is operating in a cutoff region.

The capacitor 1-8 is charged by a current supplied from the first P-channel MOS transistor 1-1 through the resistor 1-7 so that the potential at the node PC gradually rises.

At t=t1, the potential at the node PC exceeds the threshold voltage VTHN of the second N-channel MOS transistor 1-4. As a result, the second N-channel MOS transistor shifts its operation from the cutoff region to the active region and feeds back the potential at the node PC. As a result, the potential at the node PC remains approximately constant and the potential at the node PD decreases.

When the potential at the node PD decreases, the second P-channel MOS transistor 1-3 shifts its operation from the active region to the cutoff region and the second N-channel MOS transistor shifts its operation in the saturation region at t=t2. For this reason, the potential at the node PC rises again and reaches VDD [V].

Figure 2A:
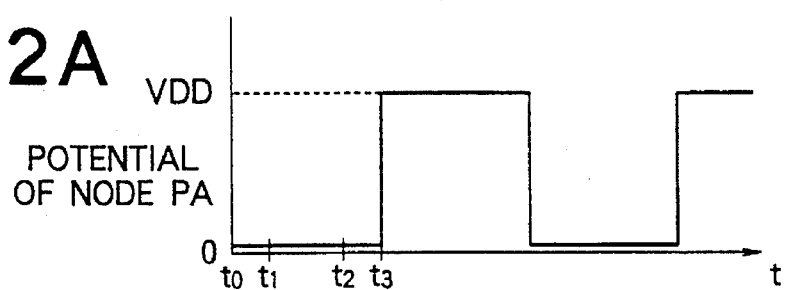
Figure 2B:
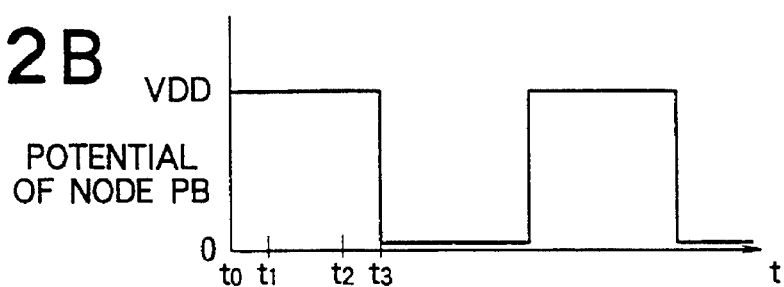
Figure 2C:
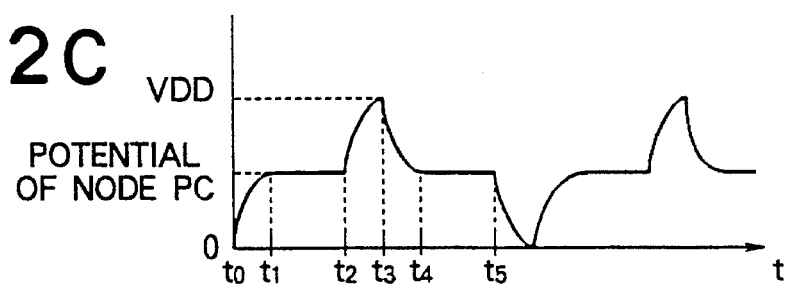
Figure 2D:
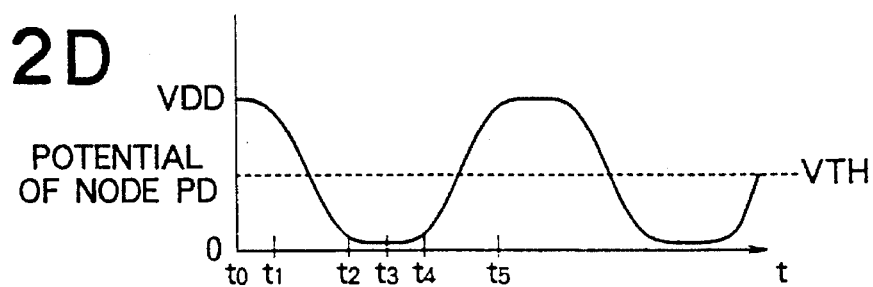
Figure 2E:
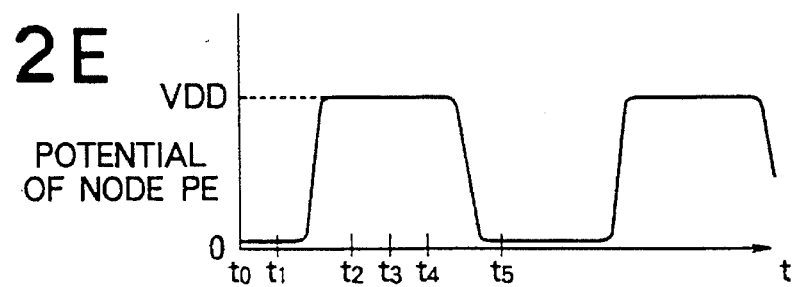

In such process of potential changes, the potential at the node PD changes as shown in FIG. 2D, and the potential at the node PE changes as shown in FIG. 2E.

At t=t3, when the potential the node PA changes to VDD, the potential at the node PB becomes at 0 [V] and the capacitor 1-8 discharges through the resistor 1-7 and the first N-channel MOS transistor 1-2. For this reason, the potential at the node PC drops.

When the potential at the node PC drops and reaches a value less than a threshold value VTHP of the second P-channel MOS-transistor 1-3 at t=t4, the operation state of the second N-channel MOS transistor 1-4 is shifted from the saturation region to the active region. The second P-channel MOS transistor 1-3 feedbacks the potential at the node PC to operate such that the potential at the node PC remains approximately constant and the potential at the node PD rises.

When the potential at the node PD rises, the operation state of the second P-channel MOS transistor 1-3 is shifted to the saturation region at t=t5 so that the potential at the node PC drops again and finally reaches 0 [V].

In such a process of voltage changes, the potential at the node PD changes as shown in FIG. 2D, the potential at the node PE changes as shown in FIG. 2E.

More specifically, as is apparent from the comparison of the potential changes at the nodes PA and PE, a digital signal input to the node PA is delayed by ((t1−t0)+(t2−t1)/2) and then output to the node PE.

The operations of the second P-channel MOS transistor 1-3 and the second N-channel MOS transistor 1-4 in each timing will be summarized as follows: t0–t1:

second P-channel MOS transistor 1-3: saturation region second N-channel MOS transistor 1-4: cutoff region
t1–t2:

second P-channel MOS transistor 1-3: active region second N-channel MOS transistor 1-4: active region
t2–t4:

second P-channel MOS transistor 1-3: cutoff region second N-channel MOS transistor 1-4: saturation region
t4–t5:

second P-channel MOS transistor 1-3: active region second N-channel MOS transistor 1-4: active region t5-:

second P-channel MOS transistor 1-3: saturation region second N-channel MOS transistor 1-4: cutoff region As has been described above, the delay circuit in this embodiment has the signal delaying section 12 constituted by the resistor 1-7, the capacitor 1-8, the second P-channel MOS transistor 1-3, the second N-channel MOS transistor 1-4. For this reason, a longer delay time can be obtained with the resistor and the capacitor having the same resistance and capacitance values as those of the conventional delay circuit.

Even if the delay time is comparatively longer, the waveform of the signal change at the node PD is approximately trapezoidal where the signal is almost fully changed between a power supply voltage and a ground voltage. For this reason, a stable delay time results which is not changed with respect to the change of the threshold value in the succeeding stage due to a temperature change, the change of the threshold voltage of each transistor, and the like.

Further, both of the N-channel and P-channel MOS transistors do not operate in the active region. For this reason, the delay circuit in this embodiment can be operated stably at lower power supply voltage compared to the conventional Miller integrator type delay circuit and is particularly useful for a system whose power supply voltage Vdd is 1.5 V or less.

In order to implement the above-described operation, the impurity concentration in the channel region or the thickness of the gate insulating film is set in order to satisfy the following equations.

$$-2Vdd/5 < VTP < -Vdd/5$$

$$Vdd/5 < VTN < 2Vdd/5$$

where Vdd represents a power supply voltage, VTP, a threshold value of the second P-channel MOS transistor 1-3, and VTN, a threshold value of the second N-channel MOS transistor 1-4.

Figure 7:
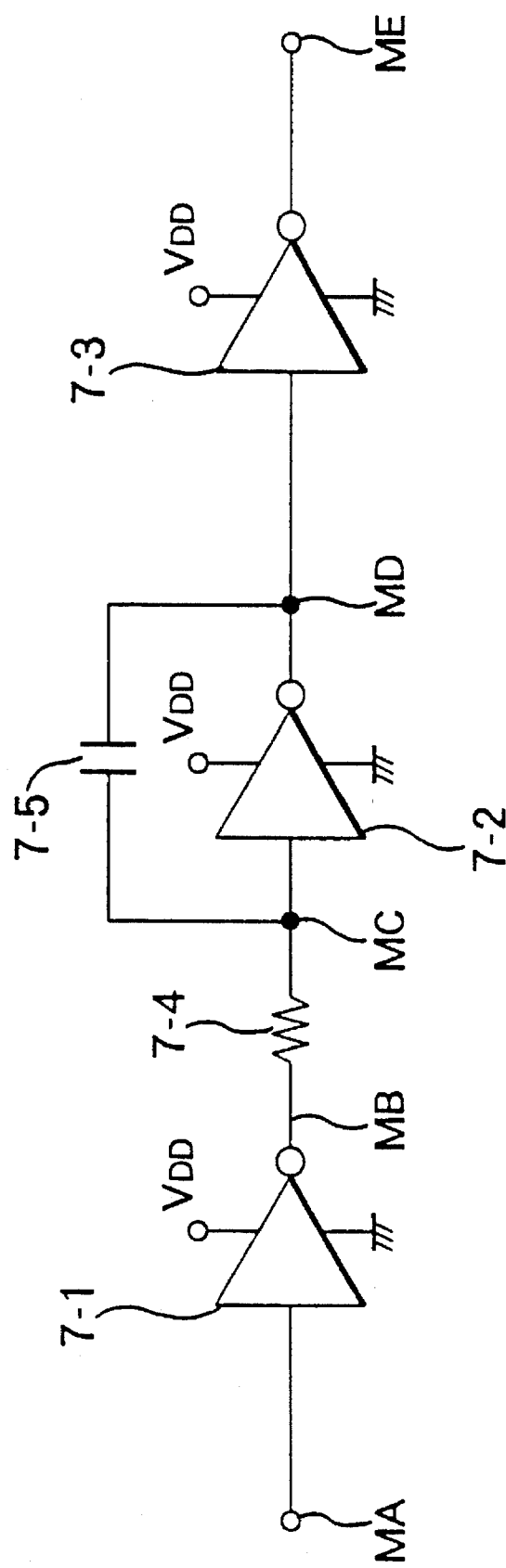
FIG. 7 is a circuit diagram of another conventional delay circuit.

Note that the threshold values of other transistors (including transistors constituting the Miller integrator shown in FIG. 7) are defined by the following equations.

$$-Vdd/5 < VTP < -Vdd/6$$

$$Vdd/6 < VTN < Vdd/5$$

Note that an absolute value of the threshold value of the second P-channel MOS transistor 1-3 may not be identical to the absolute value of the threshold value VTN of the second N-channel MOS transistor 1-4.

Further, a transition timing in the operation timing of the second P-channel MOS transistor 1-3 may differ from a transition timing in the operation region of the second N-channel MOS transistor 1-4. For example, the second P-channel MOS transistor 1-3 and the second N-channel MOS transistor 1-4 may temporarily operate in the saturation region and the active region, respectively.

Figure 3:
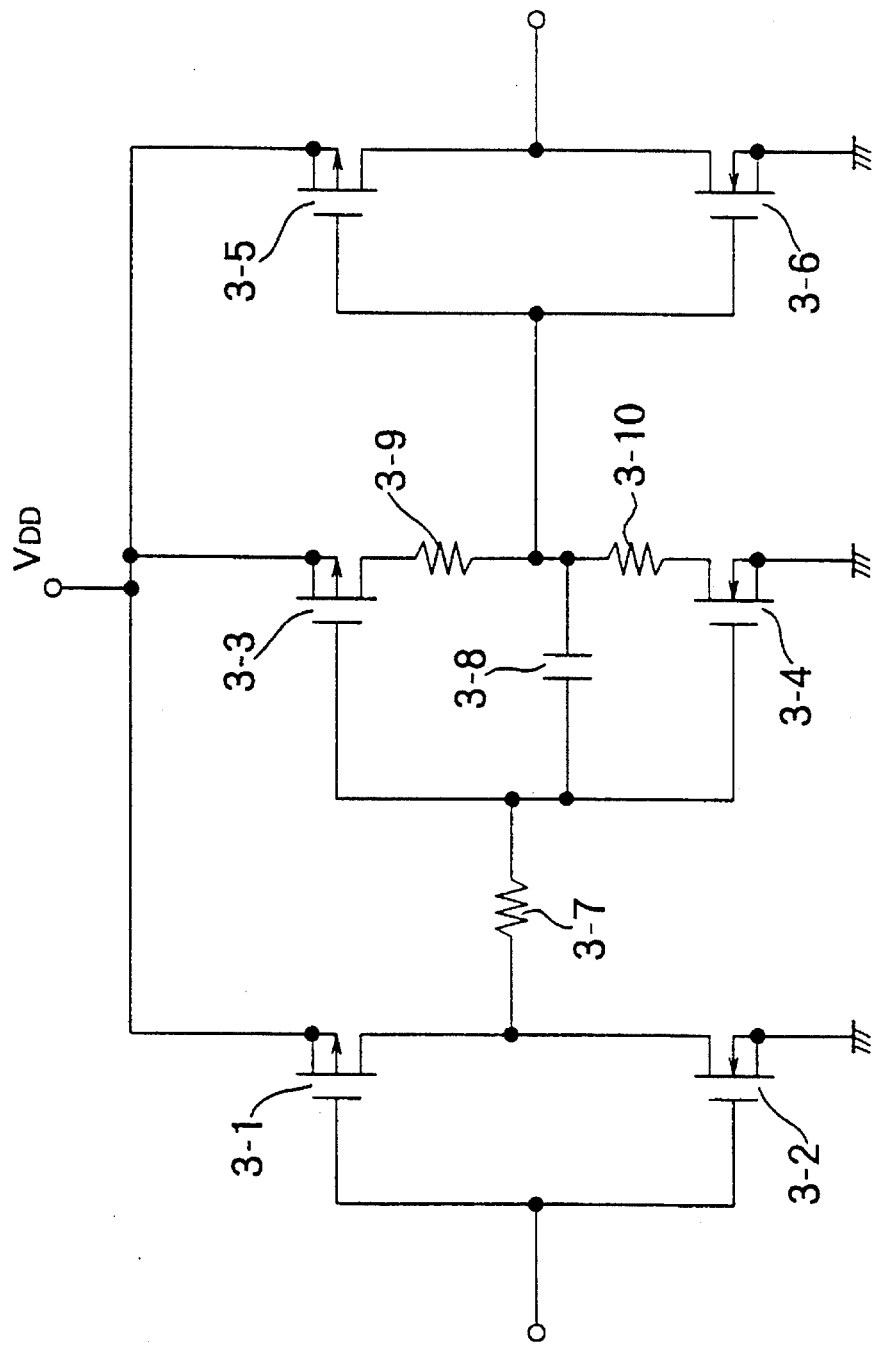
FIG. 3 is a circuit diagram of a delay circuit according to a second embodiment of the present invention.
Figure 4A:
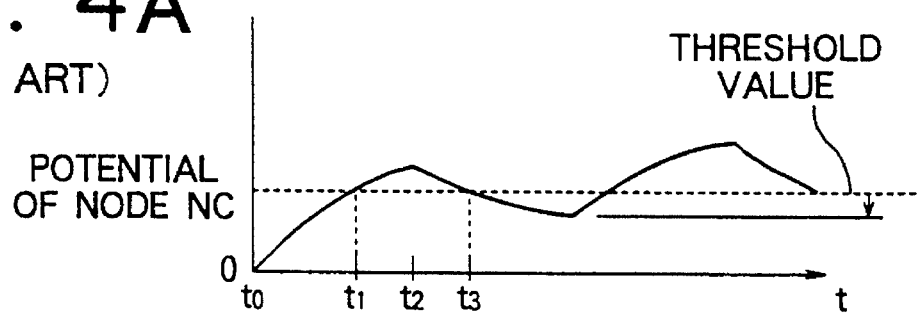
FIGS. 4A and 4B are views showing potentials at nodes NC and ND in the conventional delay circuit shown in FIG. 5.
Figure 4B:
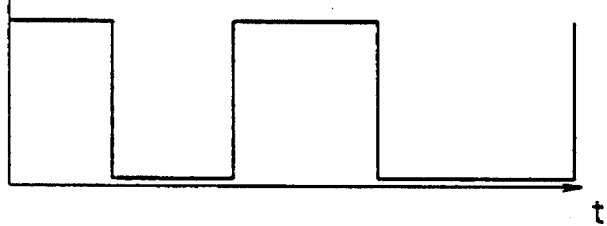
Figure 5:
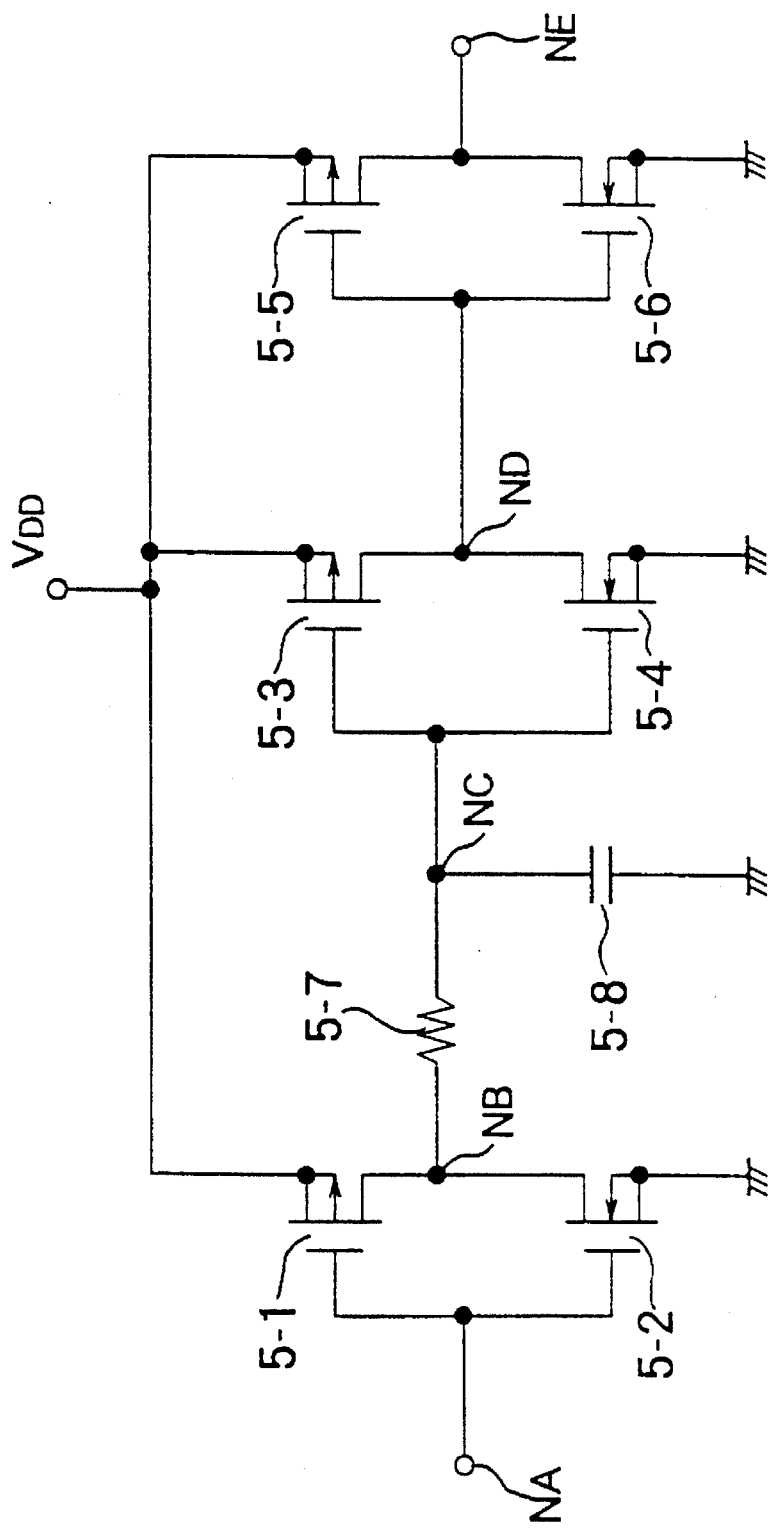
FIG. 5 is a circuit diagram showing a conventional delay circuit.
Figure 6A:
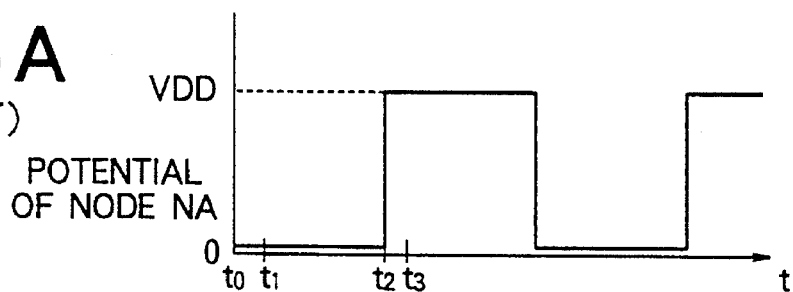
Figure 6B:
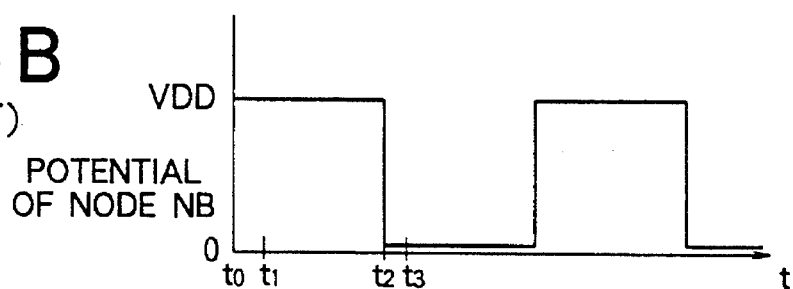
Figure 6C:
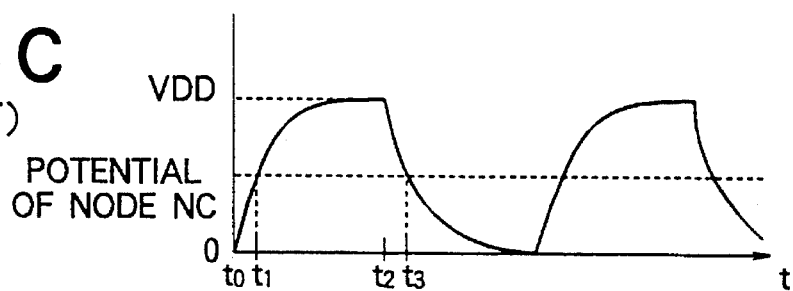
Figure 6D:
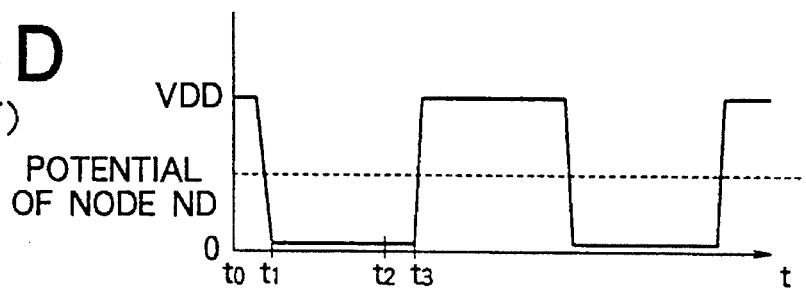
Figure 6E:
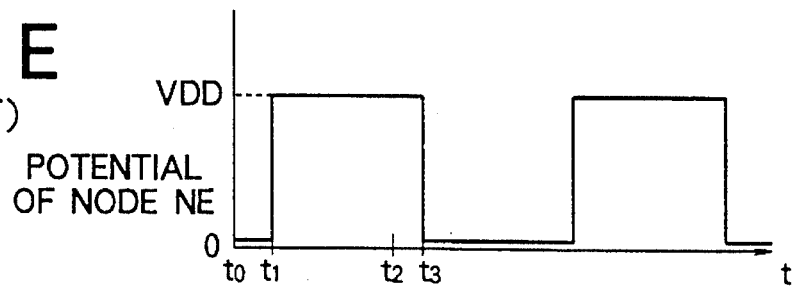

FIG. 3 is a circuit diagram showing a delay circuit according to a second embodiment of the present invention. According to the delay circuit in this embodiment, second and third resistors 3-9 and 3-10 are added in addition to the arrangement of the delay circuit in the first embodiment.

A series circuit of the second and third resistors 3-9 and 3-10 is connected between current paths of the second P-channel MOS transistor 3-3 and the second N-channel MOS transistor 3-4.

The second and third resistors 3-9 and 2-10 can contribute to reduce a penetration current flowing from the power supply voltage VDD to the ground through the second P-channel MOS transistor 3-3, the second resistor 3-9, the third resistor 3-10, and the second N-channel MOS transistor 3-4. The resistance of the second resistor 3-9 is preferably identical to the resistance of the resistor 3-10.

Note that the second and third resistors 3-9 and 3-10 may be cascade-connected to other positions in the current path of the second P-channel MOS transistor 3-3 and the second N-channel MOS transistor 3-4 in order to reduce the penetration current.

The operation of the delay circuit in the second embodiment is the same as that of the delay circuit in the first embodiment, and thus the detailed description thereof will be omitted.

What is claimed is:

1. A delay circuit comprising:

a first inverter for inverting a signal level of an input signal;

a second inverter comprising:

a first resistor, one terminal of which is connected to an output terminal of the first inverter;

a P-channel MOS transistor, a gate of which is connected to the other terminal of the first resistor and one terminal of a current path which receives a first voltage;

an N-channel MOS transistor, a gate of which is connected to the other terminal of the first resistor, one terminal of a current path which receives a second voltage, and the other terminal of the current path which is connected to the other terminal of the current path of the P-channel MOS transistor; and a capacitor, one terminal of which is connected to the other terminal of the first resistor for forming a capacitor-resistor (CR) circuit determining a delay by charging and discharging thereof, and the other terminal of which is connected to the other terminal of the current path of the P-channel MOS transistor; and a third inverter, an input terminal of which is connected to a connection node between the current path of the P-channel MOS transistor and the current path of the N-channel MOS transistor, and for inverting a signal level of an output signal of the second inverter, whereby at least one of the P-channel MOS transistor and the N-channel MOS transistor operates in a cutoff region depending on a voltage of an output signal of the first inverter, wherein a threshold value VTP2 of the P-channel MOS transistor of said second inverter and a threshold value VTN2 of the N-channel MOS transistor of said second inverter satisfy the following equations:

$$-2Vdd/5 < VTP2 < -Vdd/5$$

$$Vdd/5 < VTN2 < 2Vdd/5$$

wherein Vdd represents a difference between the first and second voltages, each of the first and third inverters comprises a P-channel MOS transistor and an N-channel MOS transistor whose current paths are cascade-connected, wherein a threshold value VTP1 of the P-channel MOS transistor and a threshold value VTN1 of the N-channel MOS transistor of the first inverter and a threshold value VTP3 of the P-channel MOS transistor and a threshold value VTN3 of the N-channel MOS transistor of the third inverter satisfy the following equations:

$$-Vdd/5 < VTP1 < -Vdd/6 \quad (1)$$

$$Vdd/6 < VTN1 < Vdd/5 \quad (2)$$

$$-Vdd/5 < VTP3 < -Vdd/6 \quad (3)$$

$$Vdd/6 < VTN3 < Vdd/5 \quad (4).$$

2. A delay circuit, comprising:

delay means, said delay means comprising:

a first resistor;

a P-channel MOS transistor including a gate connected to one terminal of the first resistor and one terminal of a current path which receives a first voltage;

an N-channel MOS transistor including a gate connected to the one terminal of the first resistor, one terminal of a current path which receives a second voltage and the other terminal of the current path which is connected to the other terminal of the current path of the P-channel MOS transistor; and a capacitor, one terminal of which is connected to the other terminal of the first resistor for forming a capacitor-resistor (CR) circuit determining a delay by charging and discharging thereof, and the other terminal of which is connected to the other terminal of the current paths of the P-Channel MOS transistor;

inverting/waveform shaping means coupled to the delay means for inverting a signal level of an output signal of the delay means and shaping a waveform of the output signal; and means for receiving an input digital signal, inverting a signal level of the digital signal, supplying the inverted signal to the other terminal of the resistor to set the P-channel MOS transistor and the N-channel MOS transistor to a predetermined state, said predetermined state including one of:

a first state wherein the P-channel MOS transistor operates in a saturation region and the N-channel MOS transistor operates in a cutoff region;

a second state wherein the P-channel MOS transistor operates in an active region and the N-channel MOS transistor operates in the active region; and a third state wherein the P-channel MOS transistor operates in the cutoff region and the N-channel MOS transistor operates in the saturation region, to thereby generate at an output terminal of the inverting/waveform shaping means a signal obtained by delaying the input digital signal for a predetermined period of time, wherein a threshold value VTP2 of the P-channel MOS transistor of said delay means and a threshold value VTN2 of the N-channel MOS transistor of said delay means satisfy the following equations:

$$-2Vdd/5 < VTP2 < -Vdd/5$$

$$Vdd/5 < VTN2 < 2Vdd/5$$

wherein Vdd represents a difference between the first and second voltages, each of the means for receiving and the inverting/waveform shaping means comprises a P-channel MOS transistor and an N-channel MOS transistor whose current paths are cascade-connected, wherein a threshold value VTP1 of the P-channel MOS transistor and a threshold value VTN1 of the N-channel MOS transistor of the means for receiving and a threshold value VTP3 of the P-channel MOS transistor and a threshold value VTN3 of the N-channel MOS transistor of the inverting/waveform shaping means satisfy the following equations:

$$-Vdd/5 < VTP1 < -Vdd/6 \quad (1)$$

$$Vdd/6 < VTN1 < Vdd/5 \quad (2)$$

$$-Vdd/5 < VTP3 < -Vdd/6 \quad (3)$$

$$Vdd/6 < VTN3 < Vdd/5 \quad (4).$$

* * * * *